US008594338B2

(12) United States Patent
Sinivaara

(10) Patent No.: US 8,594,338 B2
(45) Date of Patent: Nov. 26, 2013

(54) DISPLAY APPARATUS

(75) Inventor: Hasse Sinivaara, San Jose, CA (US)

(73) Assignee: Savox Communications Oy Ab (Ltd), Espoo (FI)

( * ) Notice: Subject to any disclaimer, the term of this patent is extended or adjusted under 35 U.S.C. 154(b) by 465 days.

(21) Appl. No.: 12/599,415

(22) PCT Filed: May 9, 2007

(86) PCT No.: PCT/FI2007/000126

§ 371 (c)(1),
(2), (4) Date: May 4, 2010

(87) PCT Pub. No.: WO2008/139018

PCT Pub. Date: Nov. 20, 2008

(65) Prior Publication Data

US 2010/0303247 A1 Dec. 2, 2010

(51) Int. Cl.
*H03G 3/00* (2006.01)
*H04R 5/02* (2006.01)

(52) U.S. Cl.
USPC .................. 381/61; 381/306; 381/333; 345/7

(58) Field of Classification Search
USPC ......... 381/61, 306, 333, 388; 345/8, 7, 9, 204
See application file for complete search history.

(56) References Cited

U.S. PATENT DOCUMENTS

| | | | | |
|---|---|---|---|---|
| 5,841,409 | A * | 11/1998 | Ishibashi et al. | 345/8 |
| 6,178,141 | B1 | 1/2001 | Duckworth et al. | |
| 7,002,617 | B1 | 2/2006 | Smith | |
| 7,436,140 | B2 * | 10/2008 | Takaji et al. | 318/466 |
| 8,183,997 | B1 * | 5/2012 | Wong et al. | 340/539.11 |
| 2001/0055059 | A1 * | 12/2001 | Satoda | 348/14.05 |
| 2006/0114749 | A1 | 6/2006 | Baxter et al. | |
| 2007/0195012 | A1 * | 8/2007 | Ichikawa et al. | 345/8 |
| 2010/0026720 | A1 * | 2/2010 | Hotta et al. | 345/652 |
| 2010/0079356 | A1 * | 4/2010 | Hoellwarth | 345/8 |
| 2010/0302401 | A1 * | 12/2010 | Oku et al. | 348/222.1 |
| 2011/0054890 | A1 * | 3/2011 | Ketola et al. | 704/231 |
| 2011/0235185 | A1 * | 9/2011 | Kanamori | 359/630 |
| 2012/0026837 | A1 * | 2/2012 | Li et al. | 367/127 |

FOREIGN PATENT DOCUMENTS

WO WO 2004/099851 A2 11/2004

OTHER PUBLICATIONS

International Search Report, dated Jan. 22, 2008, from corresponding PCT/FI2007/000126.

* cited by examiner

*Primary Examiner* — Xu Mei
(74) *Attorney, Agent, or Firm* — Young & Thompson

(57) ABSTRACT

The invention relates a method and arrangement for presenting visual information responsive to an audio signal. A solution according to the invention comprises an audio detector (101) arranged to detect an arrival direction of the audio signal, a display device (103) arranged to generate visual information (108) indicating the arrival direction of the audio signal, and a position sensor (104) arranged to generate a position signal indicating a change of a rotational position of a display surface of the display device. The display device is arranged to update the visual information according to the position signal. The solution is able to generate a visual indicator that indicates a direction from which an audio signal having a limited temporal duration, e.g. a gunshot voice, has arrived with respect to a changing rotational position of the display surface.

27 Claims, 9 Drawing Sheets

DISPLAY APPARATUS

FIELD OF THE INVENTION

The invention relates to a display apparatus, and more particularly, to a method and arrangement for presenting visual information responsive to an audio signal.

BACKGROUND

A display apparatus can be equipped with or connected to one or more acoustic sensors and operation of the display apparatus can be made responsive to an audio signal detected by the one or more acoustic sensors. For example, publication U.S. Pat. No. 7,002,617 discloses a surveillance system that comprises a camera having a lens for viewing a 360 degrees field of view, a memory for storing visual data corresponding different sectors of the field of view, an acoustic sensor for detecting a direction of a location of a source of an audio signal, selection means for selecting visual data from the visual memory according to the detected direction of the location of the source of the audio signal, and a monitor for displaying the selected visual data. As another example, publication US2002003470 discloses an active gunshot warning system which uses acoustic sensors mounted on moving vehicles, fixed locations, or in combination with moving vehicles and fixed locations. The acoustic sensors are arranged to detect the occurrence of gunshots and to use audio information from the gunshots in combination with a blast library to identify the type of weapon or weapons used. Information related to the gunshots, detailing location, direction of movement, number of shots fired, and type of weapon or weapons can be forwarded in audiovisual form to police vehicles, or to the military where appropriate, to assist the authorities in their response to the gunshots.

The technical solutions of the kind described above are, however, unable to generate a visual marker or other visual indicator that would indicate a direction from which an audio signal having a limited temporal duration, e.g. a gunshot voice, has arrived with respect to a changing rotational position (orientation) of a display apparatus. One can consider, for example, a policeman or a soldier who has heard a gunshot and needs visual information that indicates the direction from which the voice of the gunshot has arrived also in a case in which the policeman or the soldier is changing the orientation of a display apparatus used by him.

SUMMARY

In accordance with a first aspect of the invention, there is provided a new arrangement for presenting visual information responsive to an audio signal. The arrangement comprises:

- an audio detector arranged to detect an arrival direction of an audio signal,
- a display device arranged to generate visual information indicating said arrival direction of said audio signal, and
- a compass and an inclination sensor arranged to generate a position signal indicating a change of a rotational position of a display surface of said display device, wherein said display device is arranged to update the visual information according to said position signal.

In accordance with a second aspect of the invention, there is provided a new display apparatus. The display apparatus comprises:

- an audio detector arranged to detect an arrival direction of an audio signal,
- a display device arranged to generate visual information indicating said arrival direction of said audio signal, and
- a compass and an inclination sensor arranged to generate a position signal indicating a change of a rotational position of a display surface of said display device, wherein said display device is arranged to update the visual information according to said position signal.

In accordance with a third aspect of the invention, there is provided a new method for presenting visual information responsive to an audio signal. The method comprises:

- detecting an arrival direction of an audio signal,
- generating visual information that indicates said arrival direction of said audio signal,
- generating with a compass and an inclination sensor a position signal indicating a change of a rotational position of a display surface that is used for generating the visual information, and
- updating the visual information according to said position signal.

A benefit provided by embodiments of the present invention when compared with prior art solutions of the kind described above is that it is possible to generate a visual indicator that indicates a direction from which an audio signal having a limited temporal duration, e.g. a gunshot voice, has arrived with respect to a changing rotational position (orientation) of a display apparatus.

There are a lot of different applications in which different embodiments of the invention can be used. A display apparatus according to an embodiment of the invention can be for example:

- a military helmet comprising a visor that is arranged to act as a display surface for presenting visual markers that indicates an arrival direction of an audio signal with respect to the rotational position of said military helmet,
- a rifle sight comprising a transparent element (e.g. a lens) arranged to act as a display surface for presenting a visual marker that indicates an arrival direction of an audio signal with respect to the rotational position of the rifle that comprises said rifle sight,
- a vehicle mounted device comprising an electrical display screen arranged to act as a display surface for presenting a visual marker that indicates an arrival direction of an audio signal with respect to the rotational position of a vehicle carrying said vehicle mounted device,
- a system having goggles the lenses of which are arranged to act as display surfaces for presenting visual markers that indicate an arrival direction of an audio signal with respect to the rotational position of the goggles, or
- a warning device arranged to produce an acoustic alarm signal based on detection of an arriving audio signal and to present a visual marker that indicates an arrival direction of the audio signal that may mean a potential danger.

Various embodiments of the invention both as to constructions and to methods of operation, together with additional objects and advantages thereof, will be best understood from the following description of specific embodiments when read in connection with the accompanying drawings.

The embodiments of the invention presented in this document are not to be interpreted to pose limitations to the applicability of the appended claims. The verb “to comprise” is used in this document as an open limitation that does not exclude the existence of also unrecited features. The features recited in depending claims are mutually freely combinable unless otherwise explicitly stated.

BRIEF DESCRIPTION OF THE FIGURES

Embodiments of the invention presented in the sense of examples and their advantages are explained in greater detail below with reference to the accompanying drawings, in which.

DETAILED DESCRIPTION OF THE EMBODIMENTS

Figure 1:
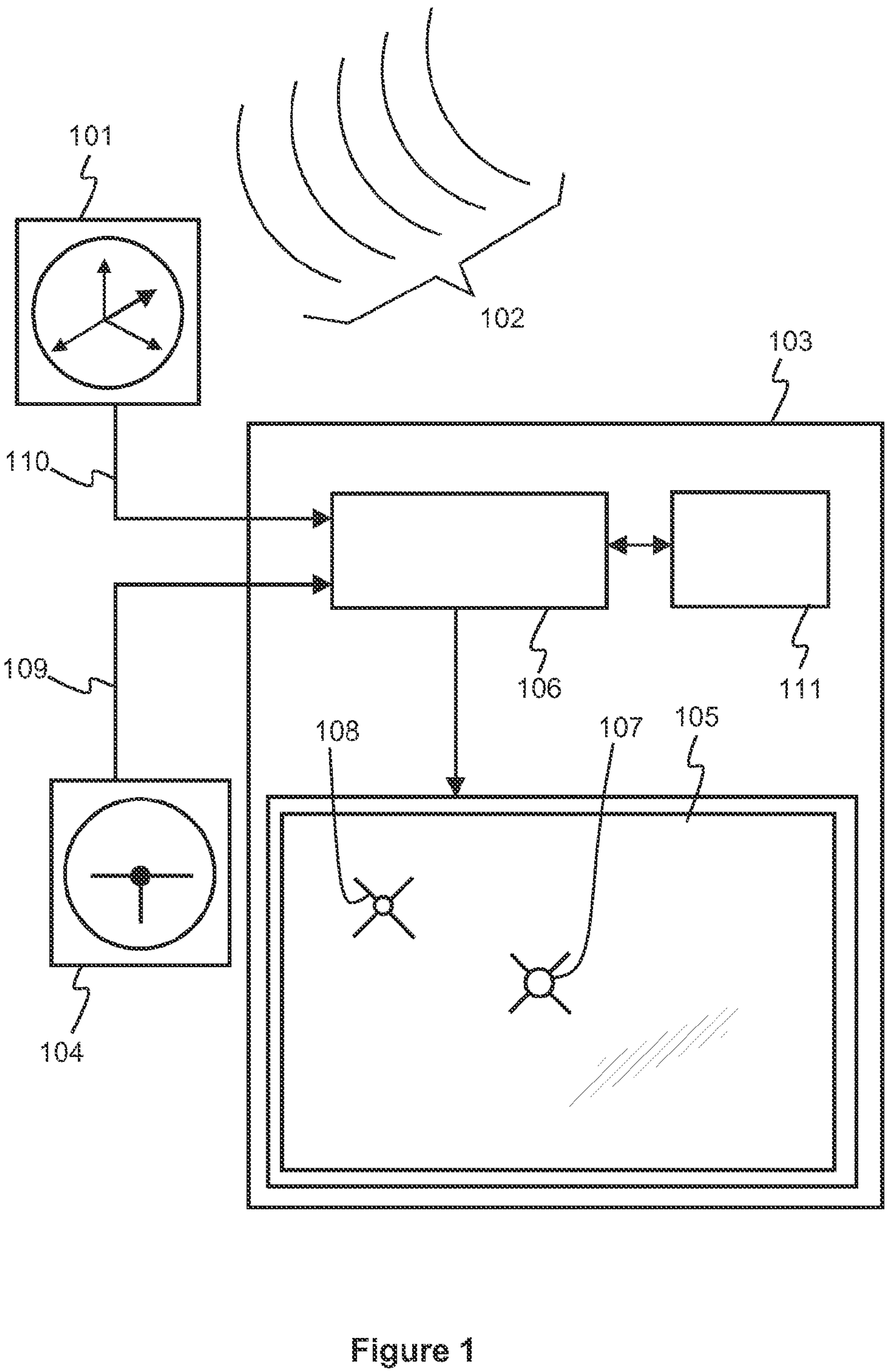
FIG. 1 shows a block diagram of an arrangement according to an embodiment of the invention for presenting visual information responsive to an audio signal.

FIG. 1 shows a block diagram of an arrangement according to an embodiment of the invention for presenting visual information responsive to an audio signal. The arrangement comprises an audio detector 101 that is arranged to detect an arrival direction of an audio signal 102 and a display device 103 that is arranged to generate visual information that indicates the arrival direction of the audio signal 103. The visual information is displayed on a display surface 105 that is a part of the display device 103. The arrangement further comprises a position sensor 104 that is arranged to generate a position signal 109 that indicates the rotational position of the display surface, or at least changes of the said rotational position. The display device 103 comprises a control unit 106 that is arranged to control the operation of the display surface 105 according to an output signal 110 of the audio detector and according to the position signal 109. The control 106 unit is arranged update the visual information according to the position signal 109 in such a way that the visual information displayed on the display surface 105 is able to follow changes of the rotational position of the display surface.

In an arrangement according to an embodiment of the invention the display surface 105 is a transparent sheet having a layer of diffractive optics arranged to present a visual marker 108 as the visual information that indicates the arrival direction of the audio signal 102. A user of the arrangement is able to see objects and landscapes through the display surface when seeing the visual marker 108.

In an arrangement according to an embodiment of the invention the display surface 105 is an electrical display screen arranged to present a visual marker 108 as the visual information that indicates the arrival direction of the audio signal 102. The electrical display screen can be, for example, a liquid crystal display (LCD) panel.

In an arrangement according to an embodiment of the invention the display surface 105 is arranged to show a visual reference marker 107 in a pre-determined location of the display surface. The reference marker 107 can be used, for example, for aligning the display surface 103 with the arrival direction of the audio signal 102. When the rotational position of display surface is varied the visual marker 108 is moving on the display surface.

In an arrangement according to an embodiment of the invention the audio detector 101 comprises at least two acoustic sensors and a calculation unit arranged to calculate the arrival direction of the audio signal on the basis of at least one of the following: a phase shift between output signals of the at least two acoustic sensors and an amplitude difference between the output signals of the at least two acoustic sensors. With two acoustic sensors it is possible to find and angle of the arrival direction of the audio signal with respect to a spatial line between the two acoustic sensors. An audio detector with two acoustical sensors can be sufficient if it is possible to assume that the arrival direction of the audio signal is substantially horizontal and the arrival direction is from −90 degrees to +90 degrees. In an arrangement according to an embodiment of the invention the audio detector 101 comprises five acoustic sensors for determining horizontal and vertical components of the arrival direction of the audio signal. The horizontal component can be from −180 degrees to +180 degrees and the vertical component, i.e. the inclination, can be from −90 degrees to +90 degrees. The five acoustic sensors can be situated with respect to each other in the same way as the five vertices of a square based pyramid are situated with respect to each other.

In an arrangement according to an embodiment of the invention the audio detector 101 is arranged to measure the level of the audio signal and to estimate a distance to a source of the audio signal on the basis of the measured level of the audio signal. An arrangement according to an embodiment of the invention can comprise, for example, a memory device 111 arranged to store reference level values. The control unit 106 can be arranged to compare a measured level of e.g. a gunshot voice to the reference level values for obtaining an estimate of a distance between a shooter and the arrangement.

Figure 2A:
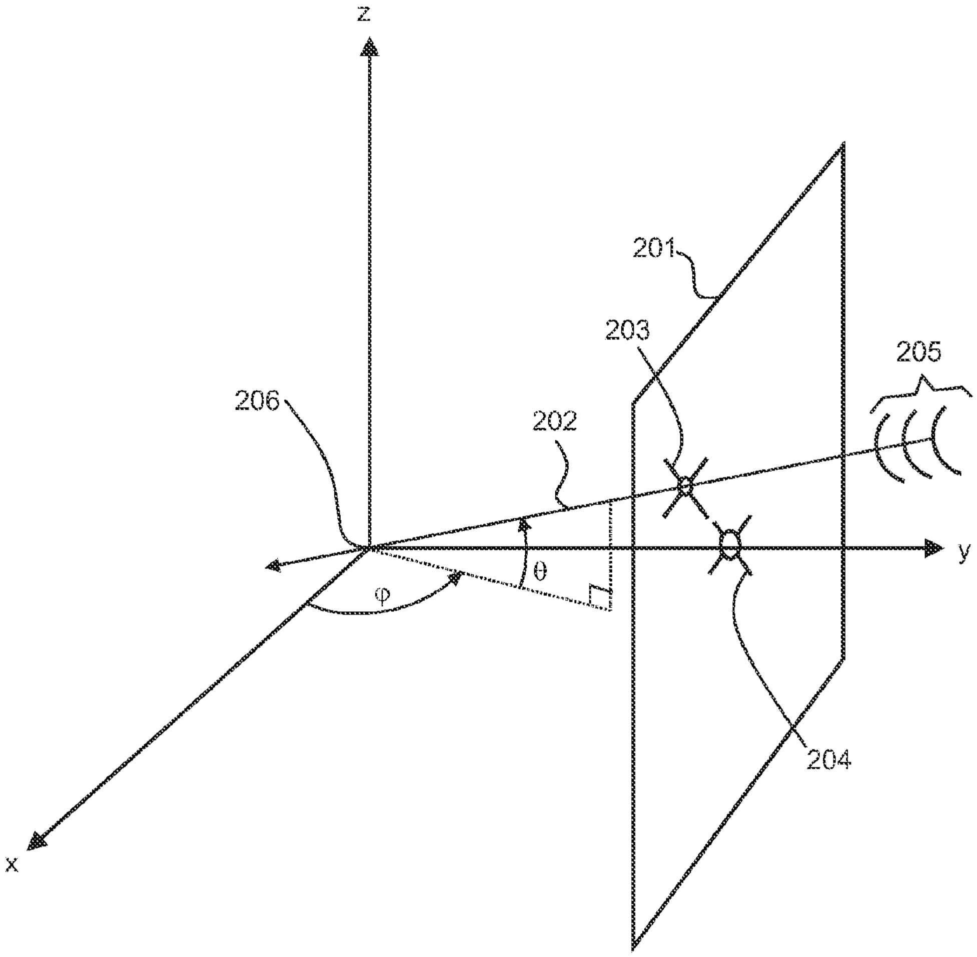
FIGS. 2*a*, 2*b*, 2*c*, 2*d*, and 2*e* illustrate principles of operation of an arrangement according to an embodiment of the invention for presenting visual information responsive to an audio signal.

FIG. 2*a* illustrates principles of operation of the arrangement shown in FIG. 1. In the following text, the reference numbers greater than 100 and less than 200 refer to FIG. 1. The display device 103 is arranged to show the visual marker 108, 203 in a location of the display surface 201, 105 in which a spatial line 202 that is parallel to the arrival direction of the audio signal 205, 102 and goes through a pre-determined observation point 206 intersects the display surface 201, 105. The visual marker 203 represents the visual information indicating the arrival direction of the audio signal. The pre-determined observation point 206 is preferably fixed with respect to the display surface. The pre-determined observation point 206 is preferably an assumed location of an eye of a user of the arrangement.

In FIG. 2*a*, a Cartesian coordinate system (xyz) is attached to the display surface in such a way that the pre-determined observation point 206 is located in the origin of the coordinate system and the display surface 201 is parallel to the xz-plane. The display device 103 is arranged to show the visual reference marker 107, 204 in a location of the display surface 201, 105 in which the display surface intersects the y-axis. When the display surface and the xyz-coordinate system are turned in such a way that the y-axis coincides with the spatial line 202 the visual marker 108, 203 is shown upon the visual reference marker 107, 204. The arrival direction of the audio signal 205, 102 can be expressed with respect to the display surface (and the xyz-coordinate system) using angles $\phi$ and $\theta$ as shown in FIG. 2*a*.

In the situation shown in FIG. 2*a* the x- and z-coordinates of the visual marker 203 are:

$$x = C \times \cos\phi / \sin\phi, \quad (1)$$

$$z = C \times \tan\theta / \sin\phi, \quad (2)$$

where C is the distance between the pre-determined observation point 206 and the display surface 201. In the above equations it has been assumed that the display surface is flat and the y-axis is perpendicular with respect to the display surface.

It can be seen from FIG. 2*a* and from equations (1) and (2) that, in order to be able to update the x- and z-coordinates of the visual marker 203, one has to know changes of the rotational position of the display surface 201 with respect to the arrival direction of the audio signal 205. Usually the arrival direction of the audio signal 205 can be, however, assumed to be fixed with respect to the Earth. The assumption is reasonably valid when the audio signal 205 has a short temporal duration like e.g. a gunshot voice, and/or when the source of the audio signal is not moving with respect to the Earth. Therefore, changes of the rotational position of the display surface 201 with respect to the arrival direction of the audio signal 205 can be detected by measuring changes of the rotational position of the display surface 201 with respect to the Earth.

In an arrangement according to an embodiment of the invention the position sensor 104 comprises motion sensors and a calculation unit arranged to calculate the position signal 109 on the basis of temporal trends of vertical and horizontal output signals of the motion sensors. The motion sensors can be, for example, acceleration sensors.

In an arrangement according to an embodiment of the invention the position sensor 104 comprises an analogue or digital compass and an inclination sensor arranged to produce the position signal. Operation of the inclination sensor can be based on e.g. the direction of the gravity force.

Figure 2B:
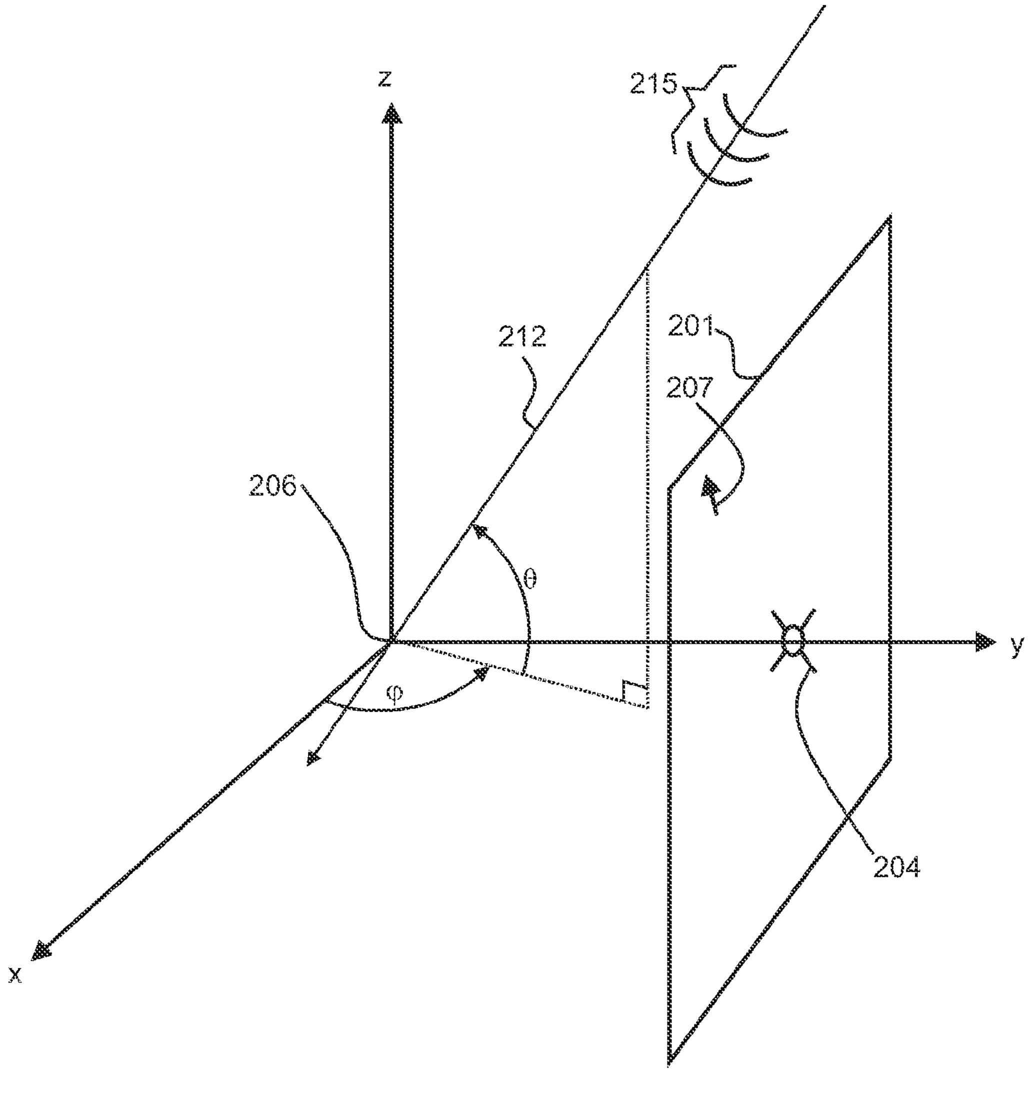

FIG. 2*b* illustrates an example situation in which an audio signal 215 arrives from such a direction that a spatial line 212 that is parallel to the arrival direction of the audio signal 215 and goes through the pre-determined observation point 206 does not intersect the display surface 201, 105.

Figure 2C:
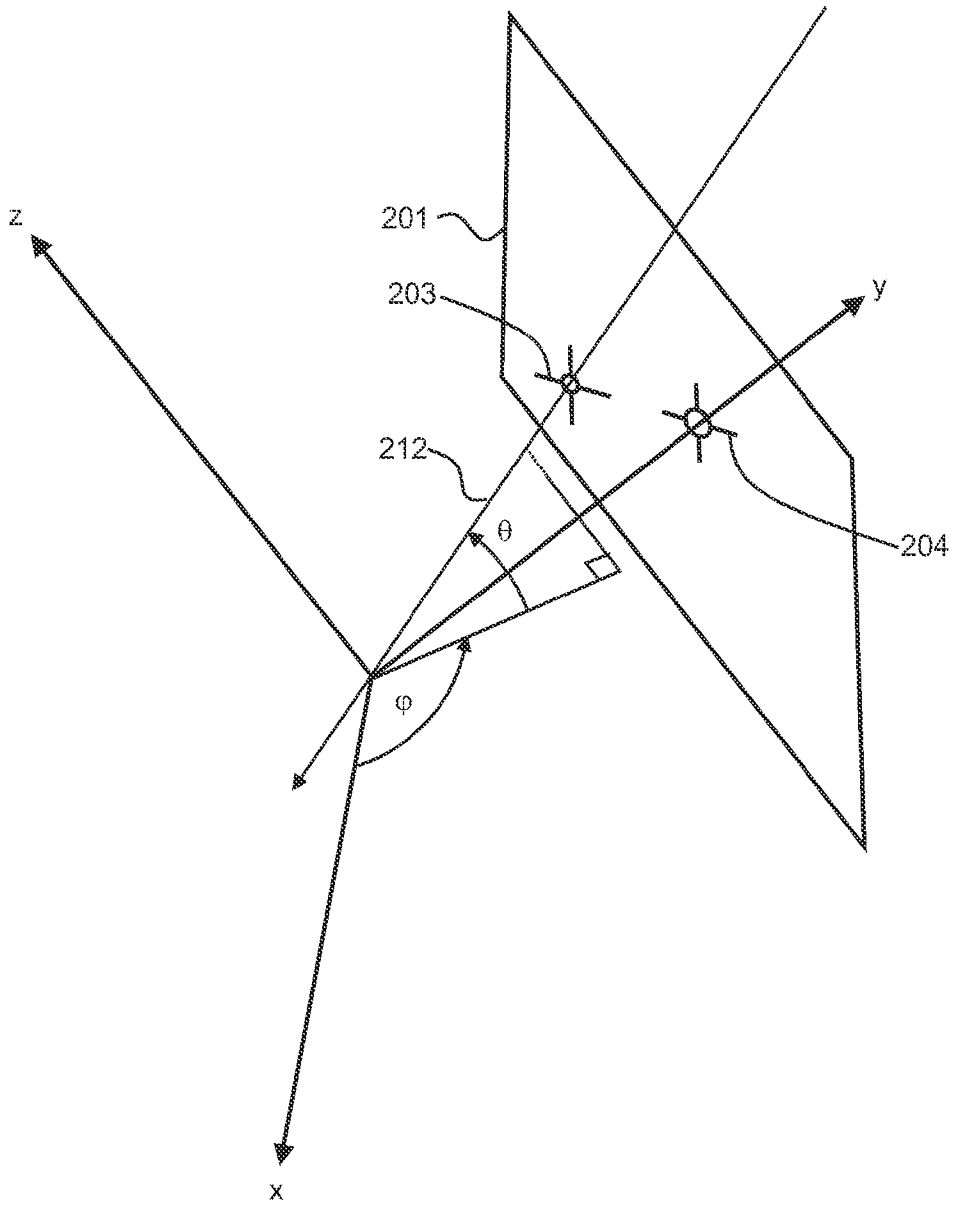

In an arrangement according to an embodiment of the invention the display device 103 is arranged to generate, as a response to the above-described situation in which the spatial line 212 does not intersect the display surface, a visual guide marker 207 that indicates a direction towards which the display surface is to be turned in order to make the display surface to intersect the spatial line 212. In FIG. 2*b* the visual guide marker 207 is an arrow that points towards the spatial line 212. FIG. 2*c* illustrates a situation in which the display surface 201 has been rotated in such a way that the display surface 201 intersects the spatial line 212.

Figure 2D:
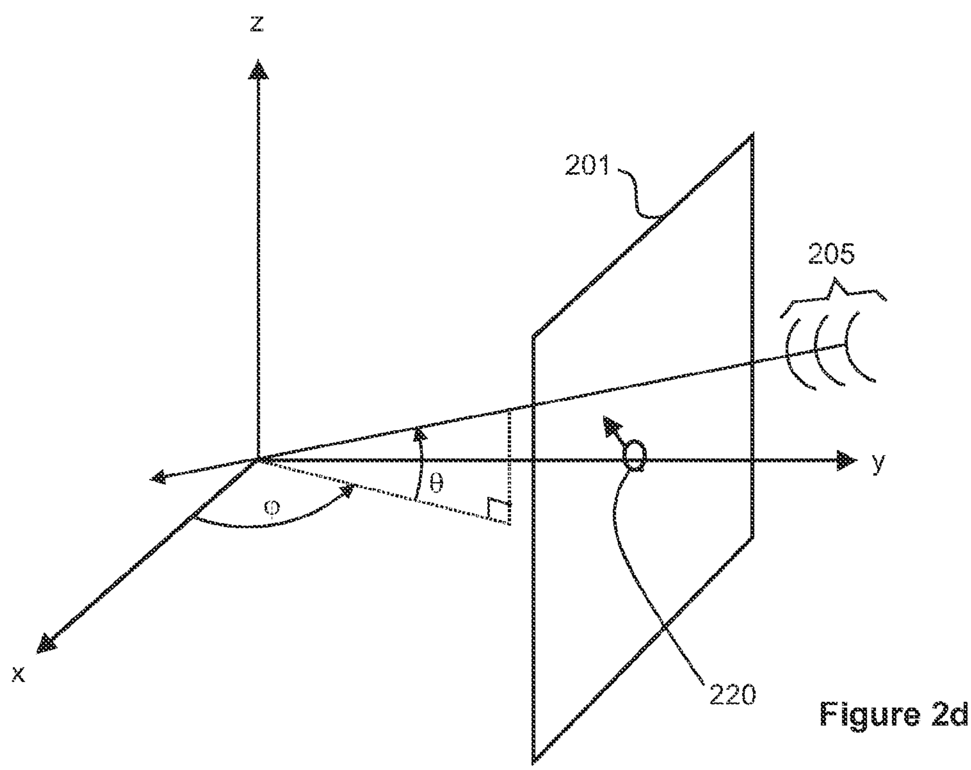
Figure 2E:
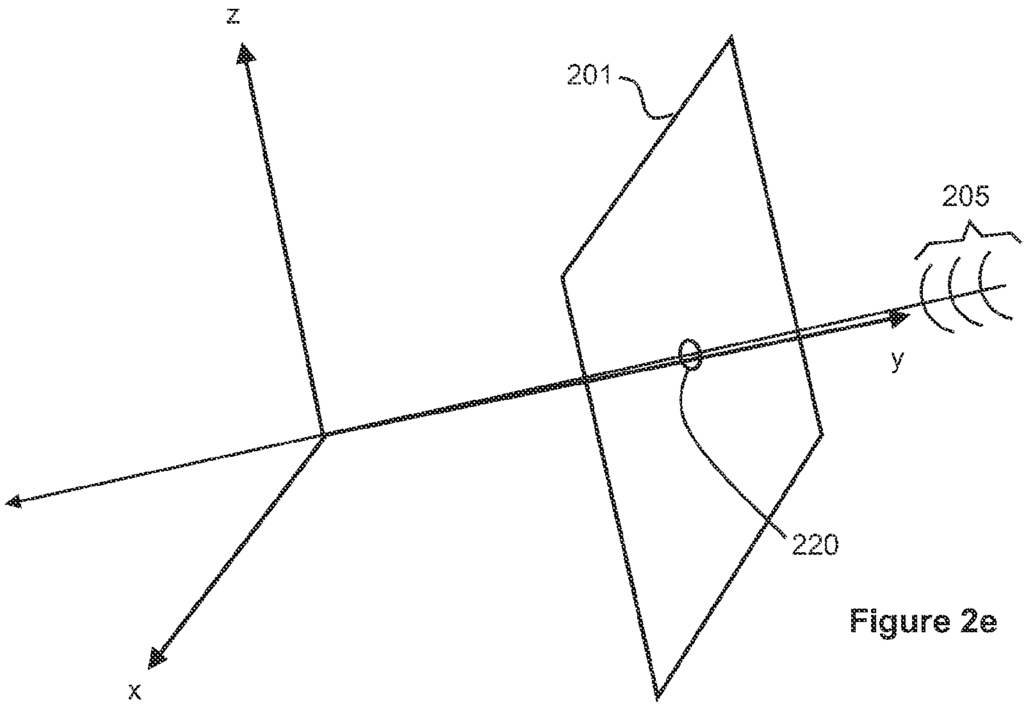

There are numerous ways to present such visual information that indicates an arrival direction of an audio signal. FIGS. 2*a*, 2*b*, and 2*c* illustrate one possible way to present such visual information that indicates an arrival direction of an audio signal. FIGS. 2*d* and 2*e* illustrate another possible way to present such visual information that indicates an arrival direction of an audio signal. In the situation shown in FIG. 2*d*, the display surface 201 is arranged to show a visual indicator 220 that shows with an arrow a direction towards which the display surface 201 has to be turned in order to align a line (the y-axis) that is perpendicular to the display surface with the arrival direction of the audio signal 205. FIG. 2*e* shows a situation in which the display surface 201 has been turned in such a way that deviation between the orientation of the line (the y-axis) that is perpendicular to the display surface 201 and the arrival direction of the audio signal 205 is less than a pre-determined tolerance value. It is also possible to make the length of the arrow of the visual indicator 220 (FIG. 2*d*) to express how much the display surface 201 has to be turned in order to align the line (the y-axis) that is perpendicular to the display surface with the arrival direction of the audio signal.

Figure 3:
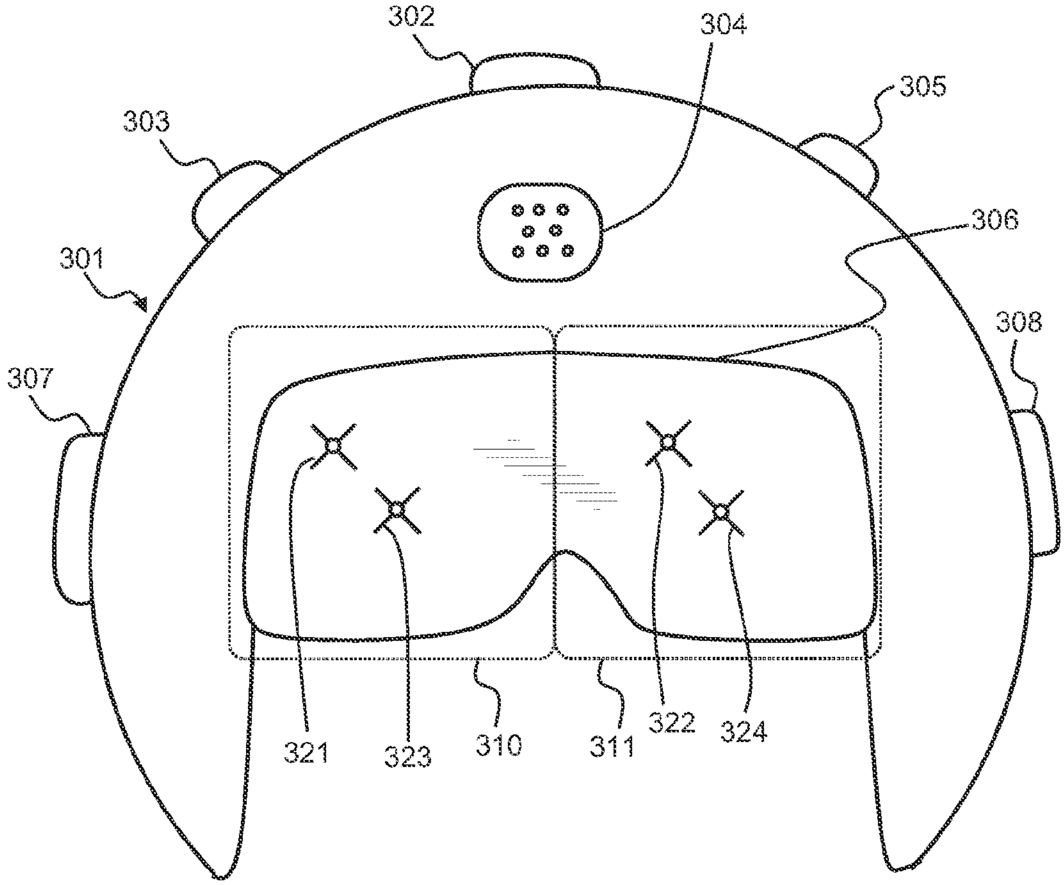
FIGS. 3, 4, and 5 show display apparatuses according to embodiments of the invention.

FIG. 3 shows a display apparatus according to an embodiment of the invention. The display apparatus is a helmet 301 that comprises position sensors 307, 308 and acoustic sensors 302-305. The helmet comprises also a fifth acoustic sensor that is located on the backside of the helmet and thus is not shown in FIG. 3. The acoustical sensors are parts of an audio detector arranged to detect an arrival direction of an audio signal. The position sensors 307 and 308 are arranged to generate a position signal indicating a change of the rotational position of the helmet. The helmet comprises a display device arranged to generate visual information indicating the arrival direction of the audio signal. The display device comprises a control unit (not shown) and a visor 306 that comprises a layer of diffractive optics arranged to present a first visual marker 321 and a second visual marker 322 as the visual information indicating the arrival direction of the audio signal. The control unit of the display device is arranged to update the locations of the first visual marker 321 and a second visual marker 322 according to the position signal.

In a display apparatus according to an embodiment of the invention the visor 306 is arranged to present the first visual marker 321 in a location of the visor in which a first spatial line that is parallel to the arrival direction of the audio signal and goes through a first pre-determined observation point intersects the visor. The visor is arranged to present the second visual marker 322 in a location of the visor in which a second spatial line that is parallel to the arrival direction of the audio signal and goes through a second pre-determined observation point intersects the visor. The principles illustrated in FIGS. 2*a*, 2*b*, and 2*c* can be applied to portions 310 and 311 of the visor respectively. The first and the second pre-determined observation points are preferably fixed with respect to the visor. The first pre-determined observation point is preferably an assumed location of a first eye of a wearer of the helmet and the second pre-determined observation point is preferably an assumed location of a second eye of the wearer of the helmet.

In a display apparatus according to an embodiment of the invention the visor 306 is arranged to present visual reference markers 323 and 324 that indicate a forward direction with respect to the helmet 301. The visual reference markers 323 and 324 are preferably presented in pre-determined locations of the visor 306.

In a display apparatus according to an embodiment of the invention the helmet 301 comprises speakers for producing an acoustic alarm signal based on an analysis of the audio signal. The acoustic alarm signal can be generated, for example, as a response to a situation in which the audio signal is analyzed to be a gunshot voice. The audio signal can be analyzed e.g. by recording the audio signal and by comparing it with pre-stored strength vs. time-profiles.

Figure 4:
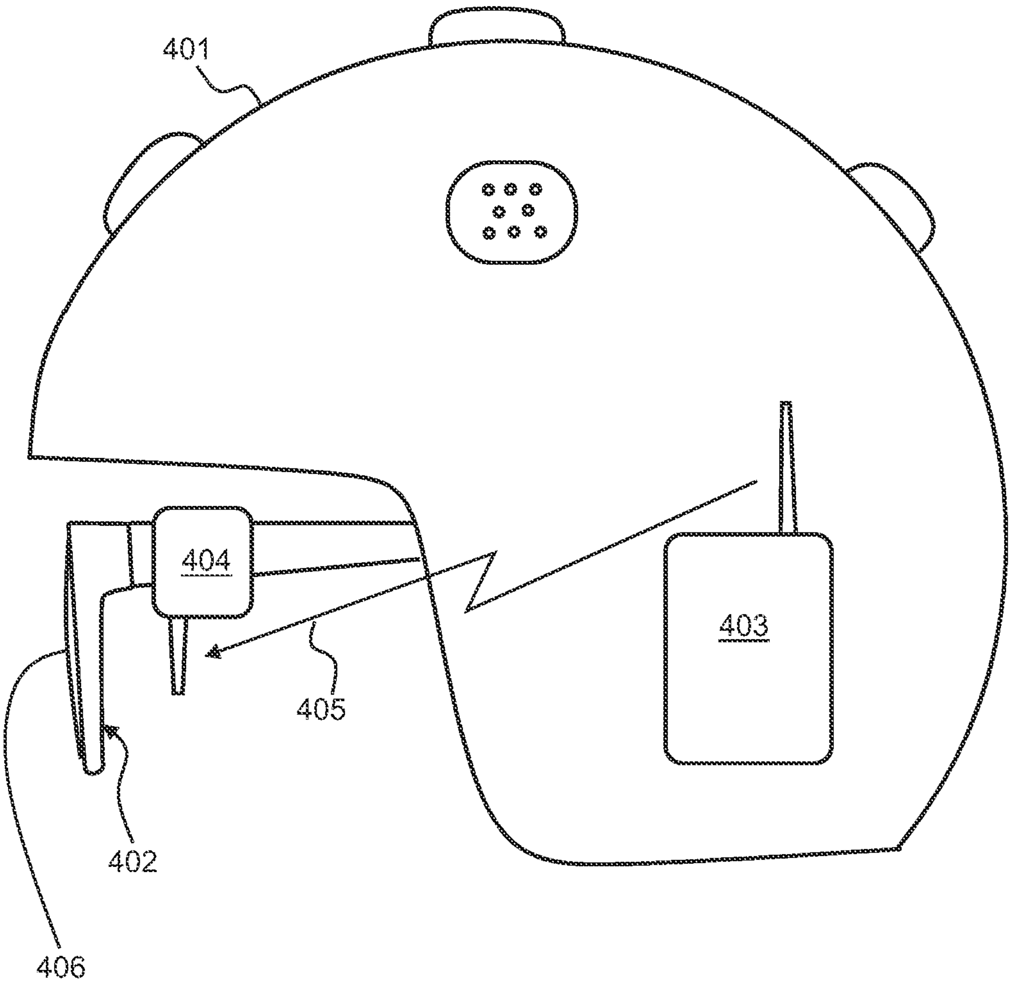

FIG. 4 shows a display apparatus according to an embodiment of the invention. The display apparatus comprises a helmet 401 and a display unit 402. The helmet comprises an audio detector arranged to detect an arrival direction of an audio signal, a position sensor arranged to generate a position signal indicating a change of the rotational position of the helmet, and a control unit 403 arranged to control the display unit 402 according to the position signal. The control unit 403 comprises a radio transmitter and the display unit 402 comprises a display surface 406 and a radio receiver 404. The radio transmitter and the radio receiver are able to establish a radio data link 405 from the control unit 403 to the display unit 402. The radio data link 405 can be replaced with a corded data link. If a corded data link is used, the control unit 403 and the display unit 402 are preferably connected also with electrical wires arranged to supply electrical power to the display unit 402 in order to avoid a need for a battery element in the display unit.

Figure 5:
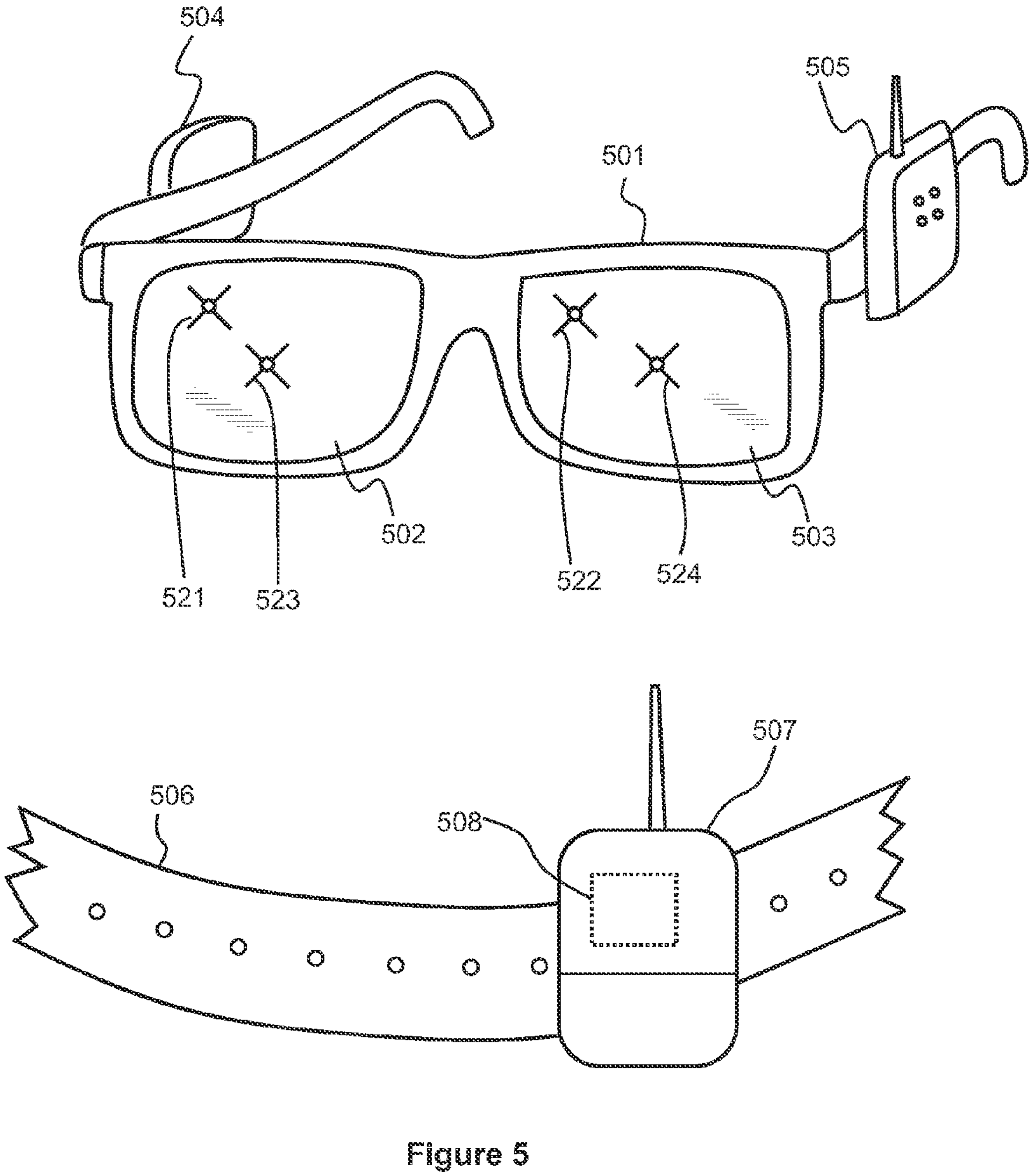

FIG. 5 shows a display apparatus according to an embodiment of the invention. The display apparatus comprises a control unit 507 and goggles 501 a first lens 502 and a second lens 503 of which are arranged to act as a display surface. The goggles 501 comprise an audio detector arranged to detect an arrival direction of an audio signal and a position sensor arranged to generate a position signal indicating a change of the rotational position of the goggles 501. The audio detector and the position sensor are situated in modules 504 and 505. The module 505 comprises also a radio transceiver arranged to establish a radio data link together with a radio transceiver of the control unit 507. The first lens 502 and the second lens 503 of the goggles 501 comprise layers of diffractive optics arranged to present a first visual marker 521 and a second visual marker 522 as visual information indicating the arrival direction of the audio signal. The control unit 507 is arranged to update the locations of the first visual marker 521 and the second visual marker 522 according to the position signal. The control unit 507 can be carried, for example, on a belt 506 of a wearer of the goggles 501. The control unit 507 comprises a memory and a calculation unit 508 arranged to perform mathematical operations needed for updating the locations of the first and the second visual markers 521 and 522. The radio data link between the goggles 501 and the control unit 507 can be replaced with a corded data link. If a corded data link is used, the control unit 507 and the goggles are preferably connected also with electrical wires arranged to supply electrical power to the goggles in order to avoid a need for a battery element in conjunction with the goggles.

In a display apparatus according to an embodiment of the invention the first lens 502 is arranged to show the first visual marker 521 in a location of the first lens in which a first spatial line that is parallel to the arrival direction of the audio signal and goes through a first pre-determined observation point intersects the first lens. The second lens 503 is arranged to show the second visual marker 522 in a location of the second lens in which a second spatial line that is parallel to the arrival direction of the audio signal and goes through a second pre-determined observation point intersects the second lens. The first and the second pre-determined observation points are preferably fixed with respect to the first and the second lenses. The first pre-determined observation point is preferably an assumed location of a first eye of the wearer of the goggles and the second pre-determined observation point is preferably an assumed location of a second eye of the wearer of the goggles.

In a display apparatus according to an embodiment of the invention the first and the second lenses 502 and 503 are arranged to present visual reference markers 523 and 524 that indicate a forward direction with respect to the goggles 501. The visual reference markers 523 and 524 are preferably presented in pre-determined locations of the first and the second lenses 502 and 503.

Figure 6:
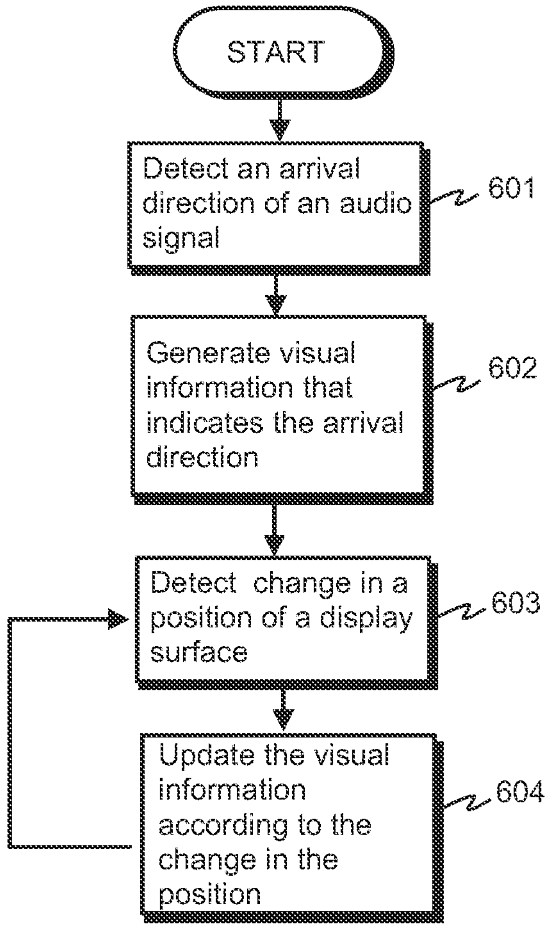
FIG. 6 is a flow chart of a method according to an embodiment of the invention for presenting visual information responsive to an audio signal.

FIG. 6 is a flow chart of a method according to an embodiment of the invention for presenting visual information responsive to an audio signal. In phase 601, an arrival direction of the audio signal is detected. In phase 602, visual information that indicates the arrival direction of the audio signal is generated. In phase 603, a change of a rotational position of a display surface that is used for generating the visual information is detected. In phase 604, the above-mentioned visual information is updated according to the detected change of the rotational position of the display surface.

In a method according to an embodiment of the invention the visual information is presented as a visual marker that is shown in a location of the display surface in which a spatial line that is parallel to the arrival direction of the audio signal and goes through a pre-determined observation point intersects the display surface. The pre-determined observation point is preferably an assumed location of an eye of a person to whom the visual information is presented.

In a method according to an embodiment of the invention a visual reference marker is shown in a pre-determined location of the display surface.

In a method according to an embodiment of the invention a visual guide marker that indicates a direction towards which the display surface has to be turned in order to make the display surface to intersect the above-mentioned spatial line is generated as a response to a situation in which the spatial line does not intersect the display surface.

While there have been shown and described and pointed out fundamental novel features of the invention as applied to embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. The specific examples provided in the description given above should not be construed as limiting. Therefore, the invention is not limited merely to the embodiments described above, many variants being possible without departing from the scope of the inventive idea defined in the independent claims appended hereto.

What is claimed is:

1. An arrangement for presenting visual information responsive to an audio signal, the arrangement comprising:

an audio detector (101) arranged to detect an arrival direction of an audio signal (102), a display device (103) arranged to generate visual information indicating said arrival direction of said audio signal with respect to a rotational position of a display surface (105) of said display device, and a compass and an inclination sensor (104) arranged to generate a position signal (109) indicating a change of the rotational position of the display surface (105) of said display device, wherein, using a change of the rotational position of the display surface is calculated with respect to the generated visual information indicating said arrival direction of the audio signal, said display device is arranged to update the visual information according to said position signal so that the updated visual information displayed on the display surface indicates said arrival direction of said audio signal with respect to the changed rotational position of the display surface of said display device, the generated signal indicating the change of the rotational position of the display surface being calculated after a temporal duration of the audio signal is finished.

2. An arrangement according to claim 1, characterized in that said display surface is a transparent sheet having a layer of diffractive optics arranged to present a visual marker (108) as the visual information indicating said arrival direction of said audio signal.

3. An arrangement according to claim 1, characterized in that said display surface is an electrical display screen arranged to present a visual marker (108) as the visual information indicating said arrival direction of said audio signal.

4. An arrangement according to claim 3, characterized in that said electrical display screen is a liquid crystal display (LCD) panel.

5. An arrangement according to claim 1, further comprising a motion sensor and a calculation unit arranged to calculate said position signal on the basis of temporal trends of vertical and horizontal output signals of the motion sensor.

6. An arrangement according to claim 1, characterized in that said audio detector comprises at least two acoustic sensors and a calculation unit arranged to calculate said arrival direction of said audio signal on the basis of at least one of the following: a phase shift between output signals of the at least two acoustic sensors and an amplitude difference between the output signals of the at least two acoustic sensors.

7. An arrangement according to claim 1, characterized in that said display device is arranged to show a visual marker (108, 203) in a location of said display surface (105, 201) in which a spatial line (202) that is parallel to said arrival direction of said audio signal (102, 205) and goes through a pre-determined observation point (206) intersects said display surface, said visual marker representing the visual information indicating said arrival direction of said audio signal.

8. An arrangement according to claim 7, characterized in that said pre-determined observation point is an assumed location of an eye of a user of the arrangement.

9. An arrangement according to claim 7, characterized in that said display device is arranged to show a visual reference marker (107, 204) in a pre-determined location of said display surface.

10. An arrangement according to claim 7, characterized in that said display device is arranged to generate, as a response to a situation in which said spatial line (212) does not intersect said display surface, a visual guide marker (207) indicating a direction towards which said display surface is to be turned in order to make said display surface to intersect said spatial line.

11. A display apparatus comprising:

an audio detector (302, 303, 304, 305) arranged to detect an arrival direction of an audio signal, a display device arranged to generate visual information indicating said arrival direction of said audio signal with respect to a rotational position of a display surface of said display device, and a compass and an inclination sensor (307, 308) arranged to generate a position signal indicating a change of the rotational position of the display surface (306) of said display device, wherein, using a change of the rotational position of the display surface calculated with respect to the generated visual information indicating said detected arrival direction of the audio signal, said display device is arranged to update the visual information according to said position signal so that the updated visual information displayed on the display surface indicates said arrival direction of said audio signal with respect to the changed rotational position of the display surface of said display device, the change of the rotational position of the display surface being calculated after a temporal duration of the audio signal is finished.

12. A display apparatus according to claim 11, characterized in that said display device comprises a display unit (402) including said display surface (406) and a separate control unit (403), the control unit comprising a radio transmitter and the display unit comprising a radio receiver (404) for establishing a radio data link (405) from the control unit to the display unit.

13. A display apparatus according to claim 11, characterized in that said display device comprises a display unit including said display surface, a separate control unit, and a corded data link between the control unit and the display unit.

14. A display apparatus according to claim 11, characterized in that said compass and said inclination sensor are mounted on a helmet (301) and said display surface is a visor (306) of the helmet, said visor of the helmet comprising a layer of diffractive optics arranged to present a first visual marker (321) and a second visual marker (322) as the visual information indicating said arrival direction of said audio signal.

15. A display apparatus according to claim 11, characterized in that the display apparatus comprises goggles (501) a first lens (502) and a second lens (503) of which are arranged to act as said display surface, the first lens and the second lens of the goggles comprising layers of diffractive optics arranged to present a first visual marker (521) and a second visual marker (522) as the visual information indicating said arrival direction of said audio signal.

16. A display apparatus according to claim 11, characterized in that the display apparatus further comprises means for producing an acoustic alarm signal based on an analysis of said audio signal.

17. A display apparatus according to claim 14, characterized in that said visor is arranged to present the first visual marker (321) in a first location of said visor (306) in which a first spatial line that is parallel to said arrival direction of said audio signal and goes through a first pre-determined observation point intersects said visor and the second visual marker (322) in a second location of said visor in which a second spatial line that is parallel to said arrival direction of said audio signal and goes through a second pre-determined observation point intersects said visor.

18. A display apparatus according to claim 17, characterized in that said first pre-determine observation point is an assumed location of a first eye of a wearer of the helmet and said first pre-determined observation point is an assumed location of a second eye of said wearer of the helmet.

19. A display apparatus according to claim 14, characterized in that said visor is arranged to present visual reference markers (323, 324) that indicate a forward direction with respect to the helmet.

20. A display apparatus according to claim 15, characterized in that said first lens (502) is arranged to show the first visual marker (521) in a location of said first lens in which a first spatial line that is parallel to said arrival direction of said audio signal and goes through a first pre-determined observation point intersects said first lens and said second lens (503) is arranged to show the second visual marker (522) in a location of said second lens in which a second spatial line that is parallel to said arrival direction of said audio signal and goes through a second pre-determined observation point intersects said second lens.

21. A display apparatus according to claim 20, characterized in that said first pre-determined observation point is an assumed location of a first eye of a wearer of the goggles and said first pre-determined observation point is an assumed location of a second eye of the wearer of the goggles.

22. A display apparatus according to claim 15, characterized in that said first and second lenses are arranged to present visual reference markers (523, 524) that indicate a forward direction with respect to the goggles (501).

23. A method for presenting visual information responsive to an audio signal, the method comprising:

detecting (601) an arrival direction of an audio signal, generating (602) visual information that indicates said arrival direction of said audio signal with respect to a rotational position of a display surface of a display device, generating (603) with a compass and an inclination sensor a position signal indicating a change of the rotational position of the display surface that is used for generating the visual information, and after a temporal duration of the audio signal is finished, using the generated position signal indicating the change of the rotational position of the display surface and the generated visual information that indicates said arrival direction of said audio signal, updating (604) the visual information according to said position signal so that the updated visual information displayed on the display surface indicates said arrival direction of said audio signal with respect to the changed rotational position of the display surface of the display device.

24. A method according to claim 23, characterized in that the method further comprises showing a visual marker in a location of said display surface in which a spatial line that is parallel to said arrival direction of said audio signal and goes through a pre-determined observation point intersects said display surface, said visual marker representing the visual information indicating said arrival direction of said audio signal.

25. A method according to claim 24, characterized in that said pre-determined observation point is an assumed location of an eye of a person to whom the visual information is presented.

26. A method according to claim 24, characterized in that the method further comprises showing a visual reference marker in a pre-determined location of said display surface.

27. A method according to claim 24, characterized in that the method further comprises generating, as a response to a situation in which said spatial line does not intersect said display surface, a visual guide marker indicating a direction towards which said display surface is to be turned in order to make said display surface to intersect said spatial line.

* * * * *

UNITED STATES PATENT AND TRADEMARK OFFICE

CERTIFICATE OF CORRECTION

PATENT NO. : 8,594,338 B2
APPLICATION NO. : 12/599415
DATED : November 26, 2013
INVENTOR(S) : Hasse Sinivaara It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 744 days.

Signed and Sealed this
Twenty-second Day of September, 2015

Michelle K. Lee

Michelle K. Lee
*Director of the United States Patent and Trademark Office*